(12) United States Patent
Yamasaki

(10) Patent No.: US 12,187,602 B2
(45) Date of Patent: Jan. 7, 2025

(54) COVER MEMBER FOR ELECTRONIC DEVICE, PACKAGE, ELECTRONIC DEVICE, AND ELECTRONIC MODULE

(71) Applicant: KYOCERA Corporation, Kyoto (JP)

(72) Inventor: Sho Yamasaki, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 406 days.

(21) Appl. No.: 17/763,369

(22) PCT Filed: Sep. 24, 2020

(86) PCT No.: PCT/JP2020/036037
§ 371 (c)(1),
(2) Date: Mar. 24, 2022

(87) PCT Pub. No.: WO2021/065672
PCT Pub. Date: Apr. 8, 2021

(65) Prior Publication Data
US 2022/0396475 A1    Dec. 15, 2022

(30) Foreign Application Priority Data

Sep. 30, 2019  (JP) ................................. 2019-178720

(51) Int. Cl.
| | | |
|---|---|---|
| *H05K 1/00* | (2006.01) | |
| *B81B 7/00* | (2006.01) | |
| *H05K 1/18* | (2006.01) | |
| *H05K 5/02* | (2006.01) | |
| *H05K 5/03* | (2006.01) | |
| *G01D 11/24* | (2006.01) | |

(52) U.S. Cl.
CPC ............ *B81B 7/0061* (2013.01); *H05K 1/181* (2013.01); *H05K 5/0213* (2013.01); *H05K 5/03* (2013.01); *B81B 2201/0257* (2013.01); *B81B 2207/09* (2013.01); *G01D 11/245* (2013.01)

(58) Field of Classification Search
CPC ......... H05K 1/181; H05K 5/0213; H05K 5/03
USPC ...................................................... 361/807
See application file for complete search history.

(56) References Cited

U.S. PATENT DOCUMENTS

| | | | | |
|---|---|---|---|---|
| 6,781,851 B2* | 8/2004 | Daoud | ................. | H05K 9/0026 |
| | | | | 428/550 |
| 6,979,773 B2* | 12/2005 | Fursich | .................. | H05K 9/003 |
| | | | | 361/816 |
| 2007/0041072 A1* | 2/2007 | Yen | ....................... | H05K 9/0088 |
| | | | | 359/244 |
| 2010/0059243 A1* | 3/2010 | Chang | ..................... | H05K 9/009 |
| | | | | 174/36 |

FOREIGN PATENT DOCUMENTS

| | | | |
|---|---|---|---|
| JP | 2012-090332 A | 5/2012 | |
| JP | 2013-201305 A | 10/2013 | |
| JP | 2018-085412 A | 5/2018 | |
| WO | WO-9704469 A1 * | 2/1997 | ............... H01F 1/22 |

* cited by examiner

*Primary Examiner* — Zhengfu J Feng
(74) *Attorney, Agent, or Firm* — Volpe Koenig

(57) ABSTRACT

Provided is a cover member for an electronic device, the cover member having a through hole extending between a first surface and a second surface. The cover member for an electronic device includes a plurality of long particles that are present in an inner wall facing the through hole and whose longitudinal direction is along a through axis of the through hole in a cross section including the through axis.

11 Claims, 8 Drawing Sheets

COVER MEMBER FOR ELECTRONIC DEVICE, PACKAGE, ELECTRONIC DEVICE, AND ELECTRONIC MODULE

TECHNICAL FIELD

The present disclosure relates to a cover member for an electronic device, a package, an electronic device, and an electronic module.

BACKGROUND ART

There are electronic devices that include electronic components such as microphones, pressure sensors, and gas sensors that function by being brought into contact with a gas. In such electronic devices, electronic components are typically accommodated in packages, and the packages typically have through holes that allow the outside air to pass therethrough. Japanese Unexamined Patent Application Publication No. 2012-90332 discloses a microphone in which the top surface of a cover that accommodates an element mounted on a substrate has a through hole.

SUMMARY OF INVENTION

A cover member for an electronic device of the present disclosure is a cover member for an electronic device that has a through hole extending between a first surface and a second surface and includes a plurality of long particles that are present in at least one inner wall facing the through hole and whose longitudinal direction is along a through axis of the through hole in a cross section including the through axis.

A package of the present disclosure includes a base member on which an electronic component is to be mounted and the above-described cover member for an electronic device that is assembled to the base member.

An electronic device of the present disclosure includes the above-described package and an electronic component that is mounted on the base member.

An electronic module of the present disclosure includes a module substrate and the above-described electronic device that is mounted on the module substrate.

DESCRIPTION OF EMBODIMENTS

An embodiment of the present disclosure will be described in detail below with reference to the drawings.

Figure 1A:
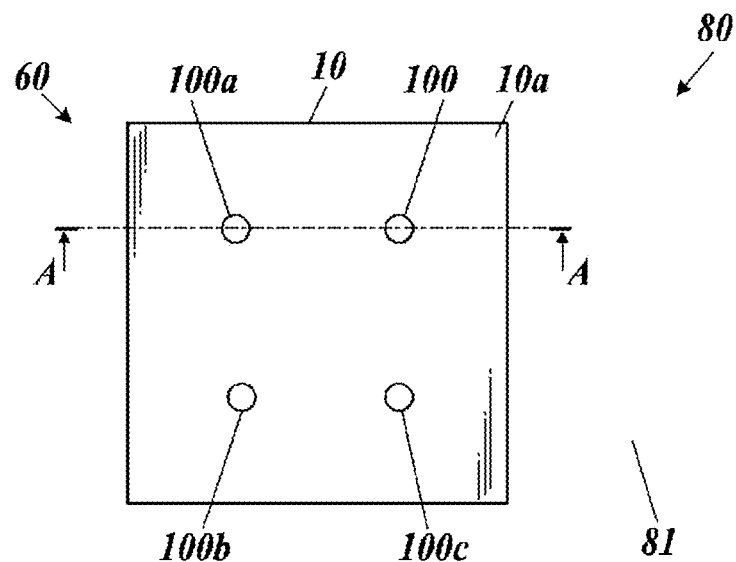
FIG. 1A is a plan view illustrating an electronic device and an electronic module of an embodiment of the present disclosure.
Figure 1B:
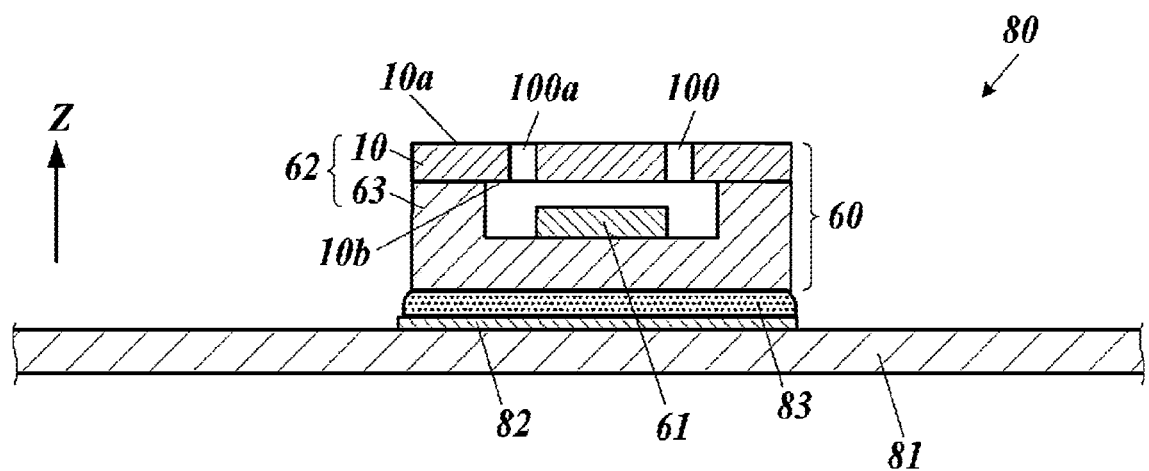
FIG. 1B is a sectional view taken along line A-A of FIG. 1A.

FIG. 1A is a plan view illustrating an electronic device and an electronic module of the embodiment of the present disclosure, and FIG. 1B is a sectional view taken along line A-A of FIG. 1A. In FIG. 1B, the Z direction corresponds to a thickness direction of a cover member 10. An electronic device 60 of the present embodiment is a device that functions by guiding the outside air or the atmospheric pressure into the device and is, for example, a microelectromechanical systems (MEMS) microphone, a pressure sensor, a gas sensor, or the like. The electronic device 60 includes an electronic component 61 that functions by being brought into contact with a gas and a package 62 in which the electronic component 61 is accommodated. The package 62 includes a base member 63 on which the electronic component 61 is to be mounted and the cover member 10 that is assembled to the base member 63.

In FIG. 1, although the cover member 10 has a plate-like shape, the cover member 10 may be, for example, a cap member that is C-shaped when viewed in cross section or a tray member that has a top plate and a wall extending downward from an edge of the top plate as long as it serves as a portion of the package 62 surrounding the electronic component 61.

The cover member 10 is made of, for example, a ceramic material such as aluminum nitride ceramic or aluminum oxide ceramic. The ceramic material may be obtained by firing a green sheet in which raw material particles of the ceramic are bonded to one another with a binder. In this case, the binder is removed by firing, and the raw material particles are bonded to one another. When the cross section of the ceramic material is observed by using an electron microscope or the like, elements that used to be the raw material particles can be identified as particles R (see FIG. 2 and FIG. 4). In the ceramic material, the shapes of the particles R can be controlled by selecting the raw material particles, and the orientations of the particles R can be controlled by the orientations of the raw material particles before firing.

Figure 3:
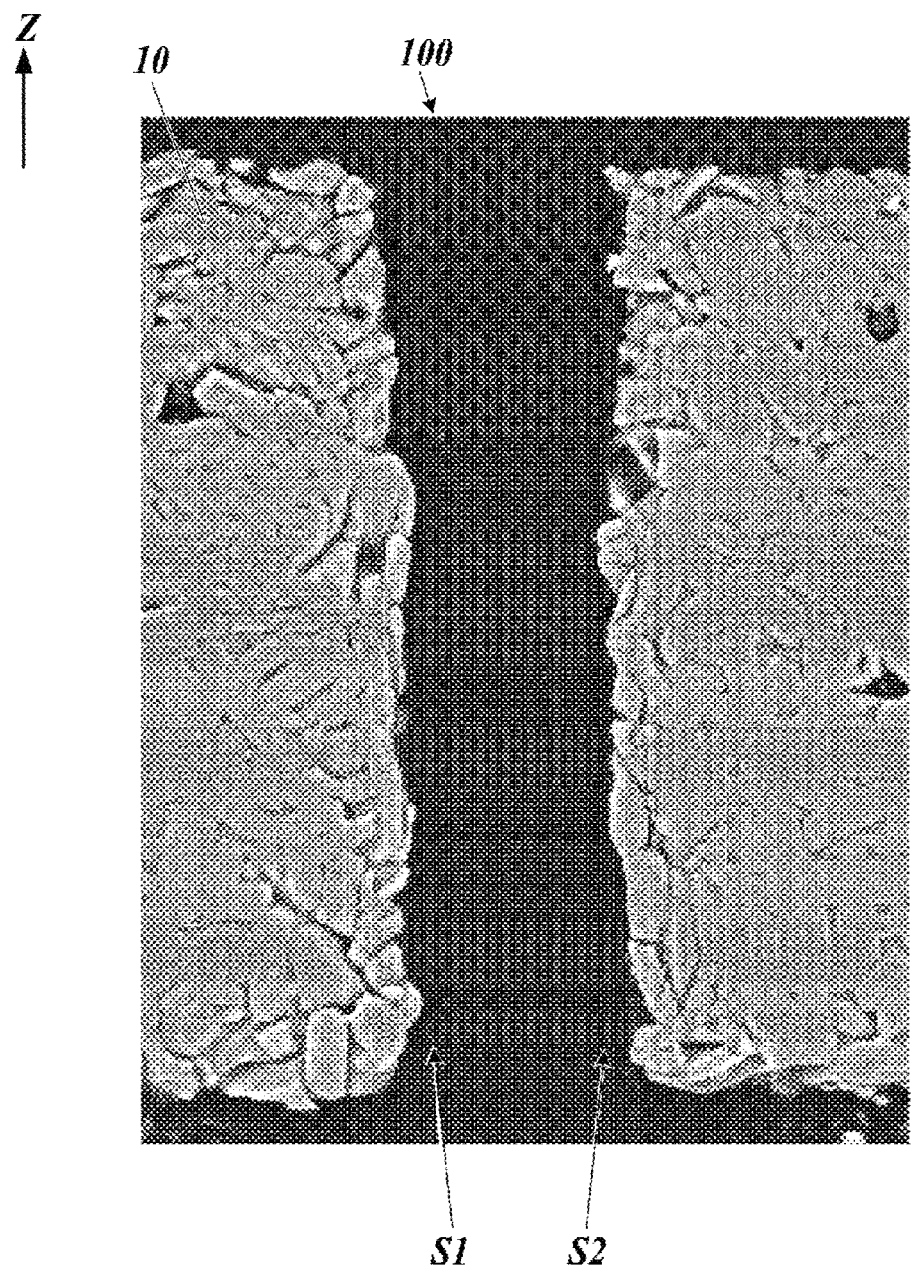
FIG. 3 is a photographic image illustrating the cross section of the principal portion of the cover member.
Figure 4:
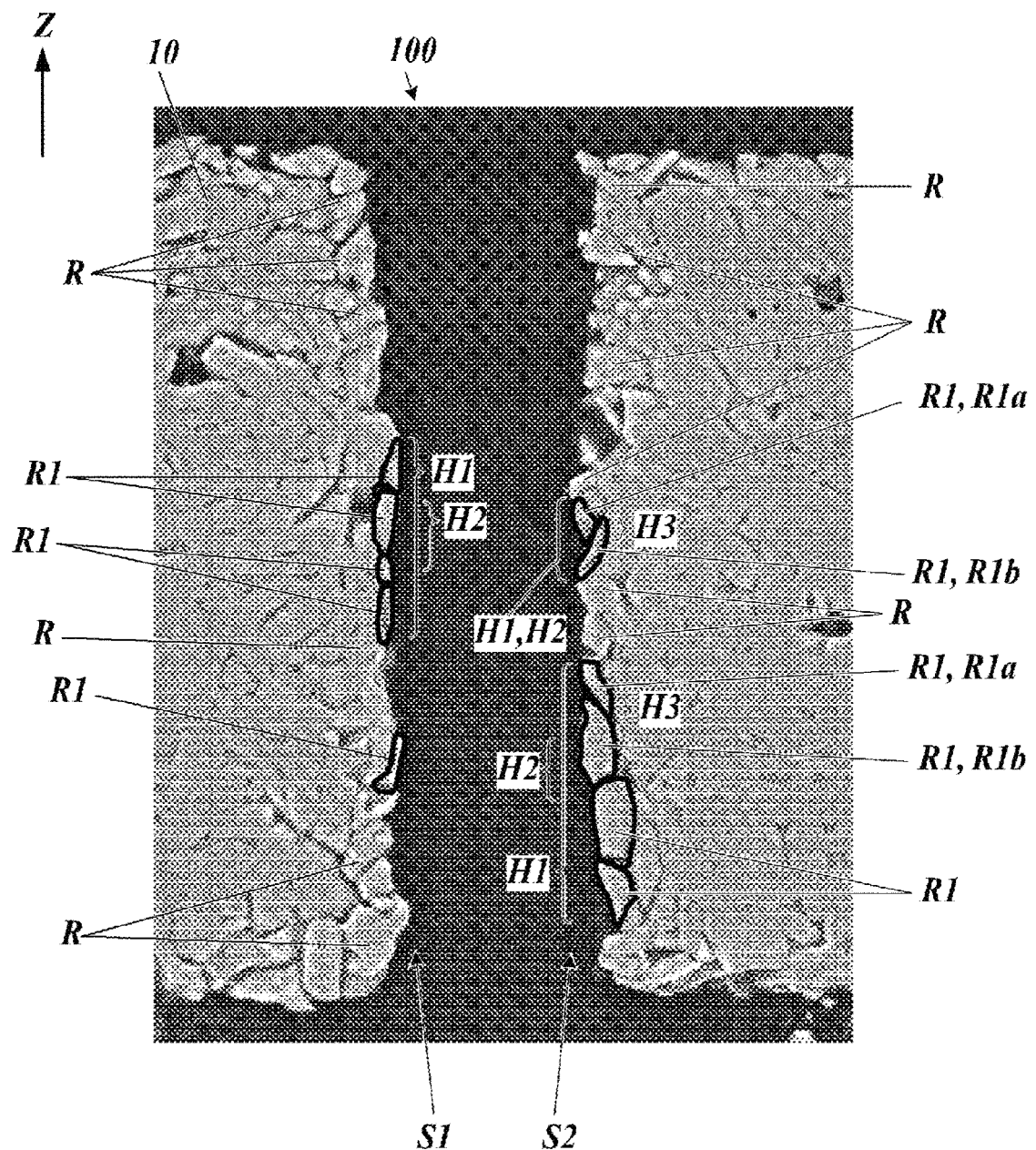
FIG. 4 is a photographic image illustrating long particles of inner walls in an emphasized manner.

The cover member 10 has through holes 100 and 100a to 100c each of which extends between a first surface (an inner surface) 10a and a second surface (an outer surface) 10b. The cover member 10 may have the single through hole 100 or may have the plurality of through holes 100 and 100a to 100c. Each of the through holes 100 and 100a to 100c (a through axis A0 thereof) may be substantially perpendicular to the first surface 10a or the second surface 10b of the cover member 10 or may be substantially perpendicular to both the first and second surfaces 10a and 10b. The hole diameter of the through hole 100 may be 10 µm to 50 µm, and the hole diameter of the through hole 100 in FIG. 3 and FIG. 4 is 25 µm. Although the single through hole 100 will be described below, the other through holes 100a to 100c may each be similar to the through hole 100.

Figure 2:
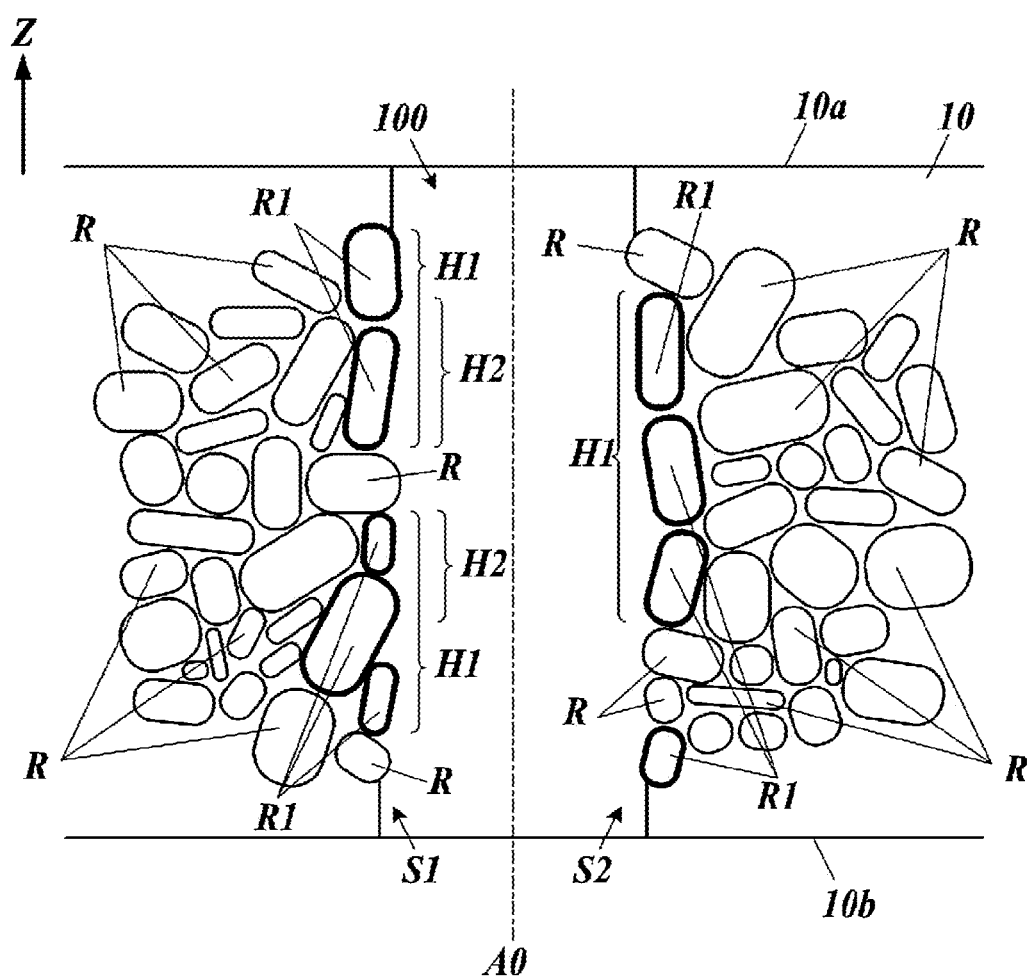
FIG. 2 is a diagram schematically illustrating particles included in a cross section of a principal portion of a cover member.

FIG. 2 is a diagram schematically illustrating particles included in a cross section of a principal portion of the cover member. FIG. 3 is a photographic image illustrating the cross section of the principal portion of the cover member.

FIG. 4 is a photographic image illustrating an example of the distribution of long particles. The cross section that is illustrated in FIG. 2 to FIG. 4 and the cross section that is illustrated in FIG. 5A and FIG. 6 to FIG. 9, which will be described later, each correspond to a cross section of the through hole 100 taken along line A-A of FIG. 1A, that is, a cross section including the through axis A0 (FIG. 2) of the through hole 100. The through axis A0 is a straight line (a central axis) that connects the center of an opening of the through hole 100 that is formed in the first surface 10a and the center of an opening of the through hole 100 that is formed in the second surface 10b. The cross section including the through axis A0 is not limited to a geometrically exact cross section exactly including the through axis A0, which is a straight line, and includes a cross section cut within a range having a width that is 10% of the diameter (the width) of the through hole 100 (the total width is one fifth of the diameter (the width) of the through hole 100) on one surface side and on the other surface side from the exact cross section.

The cover member 10 is formed of a plurality of particles bonded together, and in the cross section including the through axis A0, a plurality of particles R and R1 are present in a first inner wall S1 and a second inner wall S2 of the through hole 100. In the cross section, two inner surfaces that face the through hole 100 are the first inner wall S1 and the second inner wall S2. In the case where the hole diameter of the through hole 100 is 25 μm, the particle diameter of each of the particles R and R1 is, for example, 2 μm to 20 μm. In this case, the term "particle diameter" refers to the maximum diameter of each of the particles R and R1, and each particle diameter may be obtained by observing the cross section.

The particles R and R1 in the first inner wall S1 and the second inner wall S2 include a plurality of long particles R1 whose longitudinal direction is along the through axis A0. Each of the long particles R1 has a shape having a short axis (the minor axis), a long axis (the major axis), and the longitudinal direction (the major axis direction) and has an aspect ratio of 1.5 or more. The aspect ratio of each of the long particles R1 is the ratio of the major axis to the minor axis when the maximum diameter corresponds to the major axis and the maximum diameter (the length) in a direction perpendicular to the major axis corresponds to the minor axis. In addition, the wording "along the through axis A0" refers to the case in which the inclination angle of the major axis direction with respect to the through axis A0 is 45 degrees or smaller. Since the first inner wall S1 and the second inner wall S2 include the above-described plurality of long particles R1, the long particles R1 account for a certain percentage or more of the length of the first inner wall S1 and the second inner wall S2 in the cross section.

The aspect ratio of each of the long particles R1 may be 2 or more, and the inclination angle of the longitudinal direction of each of the long particles R1 with respect to the through axis A0 may be 45 degrees or smaller. In addition, the long particles R1 may account for 20% or more of the length of the first inner wall S1 and the second inner wall S2 in the cross section. The percentage indicates a length ratio in a direction parallel to the through axis A0. When it is said that the long particles R1 account for a certain percentage of the inner walls in the cross section, it means the percentage of the long particles R1 with respect to the sum of the first inner wall S1 and the length of the second inner wall S2. Note that the long particles R1 may account for, for example, 40% or more, 60% or more, or 80% or more of the first inner wall S1 and the second inner wall S2. When the percentage of the long particles R1 is high, as will be described later, an advantageous effect of suppressing turbulence of the flow of a gas along the through hole 100 can be obtained. On the other hand, from the standpoint of suppressing shedding of particles from the inner walls of the through hole 100, it is preferable that the long particles R1 account for 80% or less of the first inner wall S1 and the second inner wall S2. The particles R other than the long particles R1 include particles R each of whose inclination angle is large (larger than 45 degrees) and each of which is less likely to be shed because it greatly engages one of the inner walls. As a result of such particles R being included in the inner walls, shedding of the long particles R1 that are in contact with the particles R and each of whose inclination angle is small can also be suppressed.

Figure 5A:
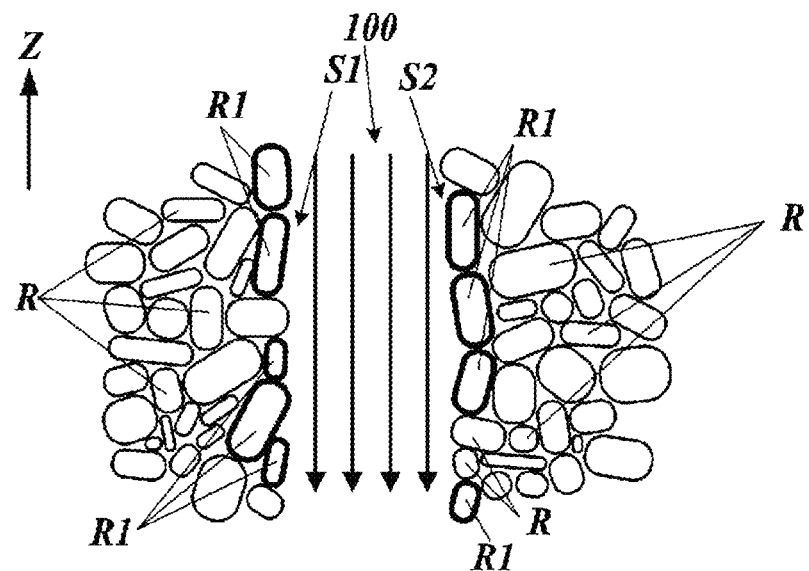
FIG. 5A is a diagram illustrating an operation when a gas flows through a through hole of the embodiment.
Figure 5B:
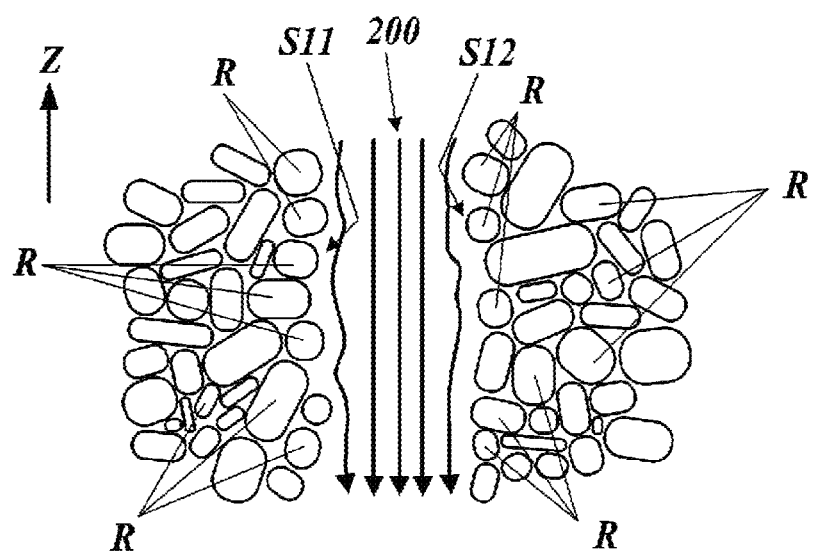
FIG. 5B is a diagram illustrating an operation when the gas flows through a through hole of a comparative example.

FIG. 5A is a diagram illustrating an operation when a gas flows through the through hole of the embodiment. FIG. 5B is a diagram illustrating an operation when the gas flows through a through hole of a comparative example. In FIG. 5A and FIG. 5B, a flow of the gas is indicated by the bold arrows. A through hole 200 of a comparative example has inner walls S11 and S12, and particles R each of which has an aspect ratio of less than 2 or particles R each of whose inclination angle, which is mentioned above, is 45 degrees or larger occupy substantially the entire inner walls S11 and S12. As illustrated in FIG. 5A, according to the distribution and the percentage of the long particles R1 such as those mentioned above, the inner surface of the through hole 100 is smoother, and turbulence of the gas flow when the gas flows through the through hole 100 is more suppressed compared with the comparative example illustrated in FIG. 5B. Thus, for example, the pressure difference between the inside and the outside of the package 62 is quickly reduced, or the outside air stably flows into the package 62, and thus, the operating accuracy of the electronic component 61, which functions by being brought into contact with the gas, is improved, and improvement of the accuracy of the electronic device 60 can be achieved.

<Distribution Pattern of Long Particles>

In the through hole 100 of the embodiment, the long particles R1 may be present in both the first inner wall S1 and the second inner wall S2. Focusing only on the first inner wall S1, the long particles R1 may account for 20% or more of the first inner wall S1. Focusing only on the second inner wall S2, the long particles R1 may account for 20% or more of the second inner wall S2. Note that the long particles R1 may account for, for example, 40% or more, 60% or more, or 80% or more of each of the first inner wall S1 and the second inner wall S2. In addition, from the standpoint of suppressing shedding of particles from the inner walls of the through hole 100, the long particles R1 may account for 80% or less of each of the first inner wall S1 and the second inner wall S2.

In addition, in the present embodiment, the first inner wall S1 and the second inner wall S2 may each have a region in which the plurality of long particles R1 are contiguously arranged (distribution pattern 1; see the regions H1 illustrated in FIG. 2 and FIG. 4). Furthermore, the inner walls (S1, S2) of the through hole 100 may have portions in which the long particles R1 of the first inner wall S1 (corresponding to first long particles of the present disclosure) and the long particles R1 of the second inner wall S2 (corresponding to second long particles of the present disclosure) face one another (distribution pattern 2; see the regions H2 illustrated in FIG. 2 and FIG. 4).

By such a distribution pattern 1 or 2, the smoothness of the first inner wall S1 and the second inner wall S2 of the through hole 100 is improved, and turbulence of the gas flow when the gas flows through the through hole 100 is further suppressed. Thus, the accuracy of the electronic device 60 can be further improved. By combining the distribution pattern 1 and the distribution pattern 2, the effect of suppressing turbulence of the gas flow can be further enhanced.

<Long Particles Having Tapered Shape>

Figure 6:
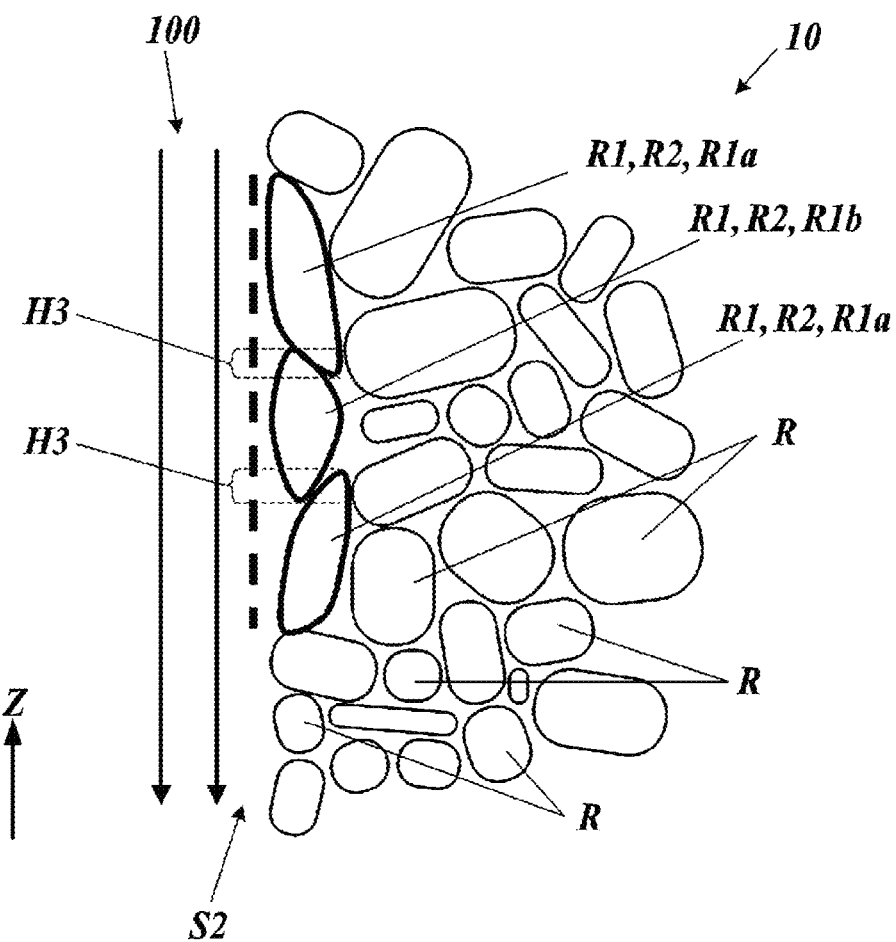
FIG. 6 is a diagram illustrating particles each having a specific shape and an example of the distribution of these particles.
Figure 7:
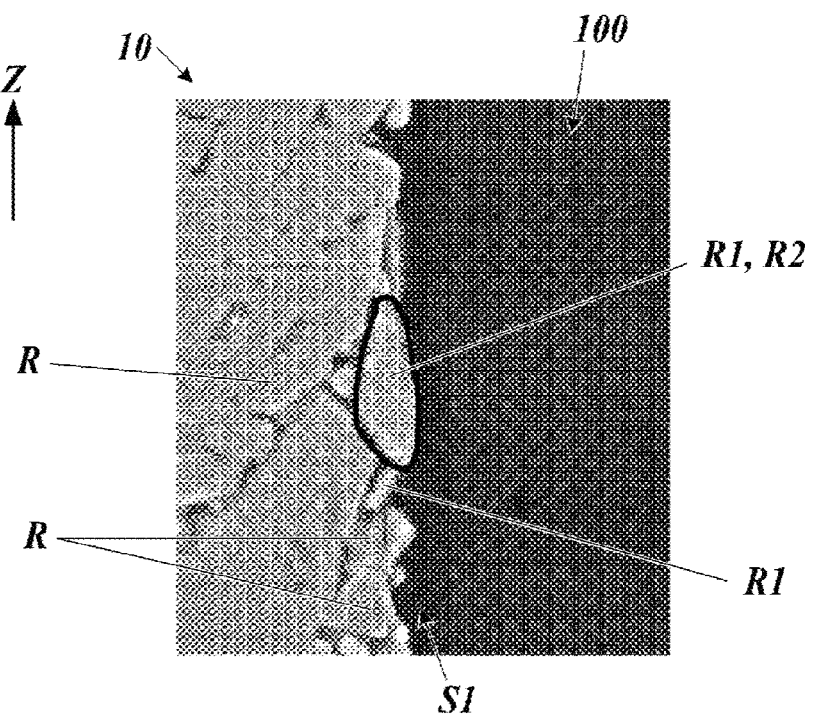
FIG. 7 is a photographic image illustrating an example of a particle having a specific shape.

FIG. 6 is a diagram illustrating particles each having a specific shape and an example of the distribution of these particles. FIG. 7 is a photographic image illustrating an example of a particle having a specific shape.

In the cover member 10 of the present embodiment, the long particles R1 that are located in the first inner wall S1 and the second inner wall S2 of the through hole 100 may include specific shaped particles R2 as illustrated in FIG. 6 and FIG. 7. The specific shaped particles R2 are particles each of which has a tapered shape. The term "tapered shape" refers to a shape of one of the particles R that has a front end portion, an intermediate portion, and a rear end portion, which are obtained by dividing the particle R into three equal-length portions in the longitudinal direction, the front and rear end portions each being gradually tapered toward its end.

As a result of the specific shaped particles R2 being included in the first inner wall S1 and the second inner wall S2, as illustrated in FIG. 6, the smoothness of the first inner wall S1 and the smoothness of the second inner wall S2 are improved. For example, the degree of unevenness in a portion that is indicated by a bold dashed line in FIG. 6 is small. Consequently, turbulence of the gas flow when the gas flows through the through hole 100 is further suppressed, and thus, the accuracy of the electronic device can be further improved. By combining the configuration including the specific shaped particles R2 with the above-mentioned distribution pattern 1, the above-mentioned distribution pattern 2, or both of these distribution patterns, the effect of suppressing turbulence of the gas flow can be further enhanced.

<Overlapping Region of Long Particles>

In the through hole 100 of the cover member 10 of the present embodiment, either or both of the first inner wall S1 and the second inner wall S2 have overlapping regions H3 in each of which a long particle R1a and a long particle R1b are adjacent to each other and overlap each other in a length direction thereof (see FIG. 4 and FIG. 6). In the cross section including the through axis A0 (FIG. 1) of the through hole 100, when the upper end of the long particle R1a, the upper end of the long particle Rib, the lower end of the long particle R1a, and the lower end of the long particle R1b are positioned in this order starting from the upper side, each of the overlapping regions H3 corresponds to a region extending from the lower end of the long particle R1a to the upper end of the long particle R1b. Here, the direction parallel to the through axis A0 is defined as a height direction (the vertical direction). Shedding of particles from the inner walls of the through hole 100 during manufacture or use of the electronic device can be suppressed by the overlapping regions H3. The smoothness of the first inner wall S1 and the smoothness of the second inner wall S2 can be maintained by suppressing shedding of particles, so that suppression of turbulence of the gas flow when the gas flows through the through hole 100 is can be maintained, and improvement of the accuracy of the electronic device 60 can be maintained. Each of the overlapping regions H3 may be less than half the length of the corresponding long particles R1a and R1b in the longitudinal direction. In this case, the smoothness of each of the overlapping regions H3 of the first inner wall S1 and the second inner wall S2 can be further improved.

In addition, the long particles R1a and R1b overlapping each other in each of the overlapping regions H3 may be the above-mentioned specific shaped particles R2. In this case, the smoothness of each of the overlapping regions H3 of the first inner wall S1 and the second inner wall S2 can be further improved.

<Central Arrangement of Long Particles>

Figure 8:
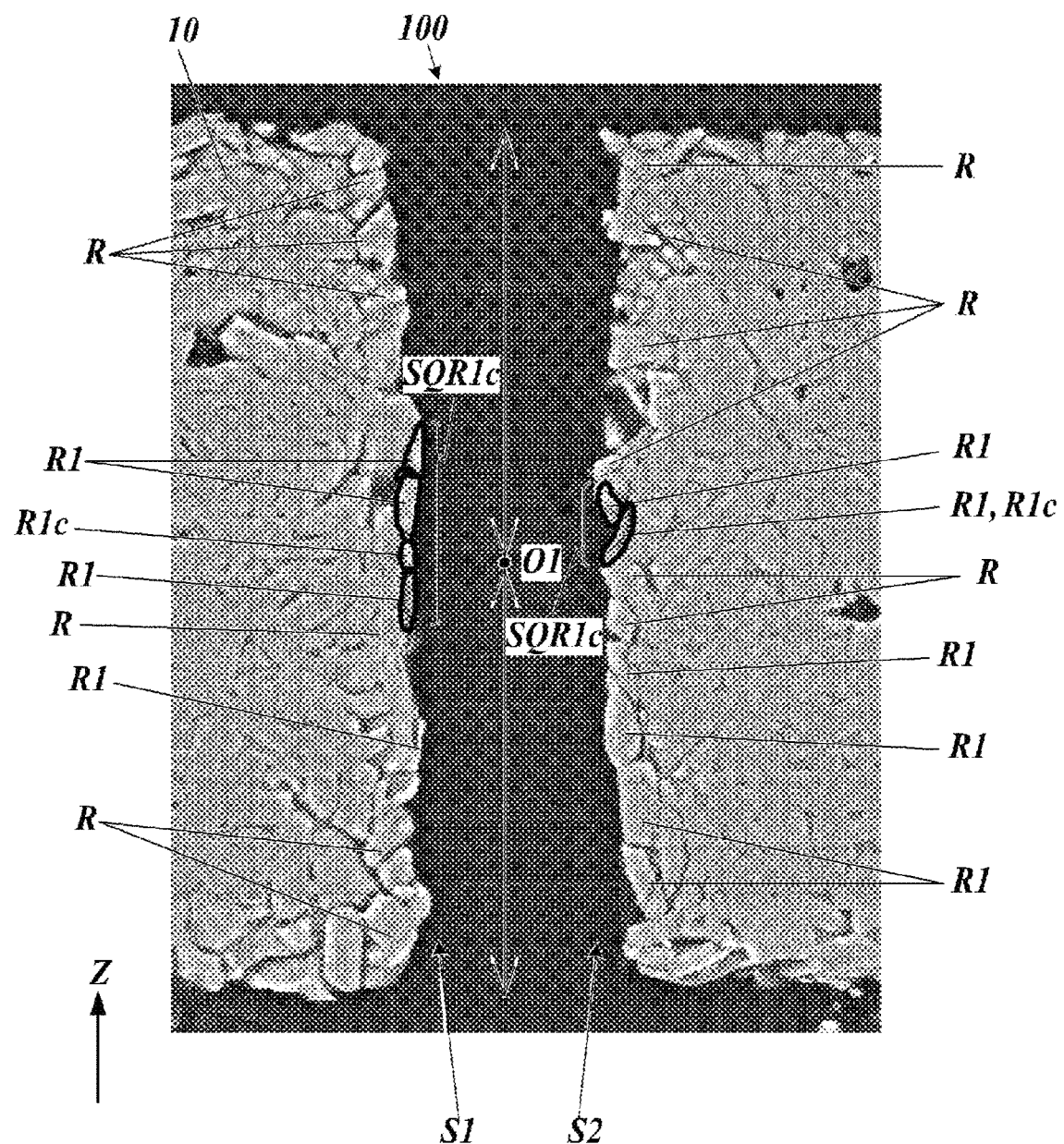
FIG. 8 is a photographic image illustrating a cross section of a principal portion of the cover member, the cross section including the long particles that are centrally arranged.
Figure 9:
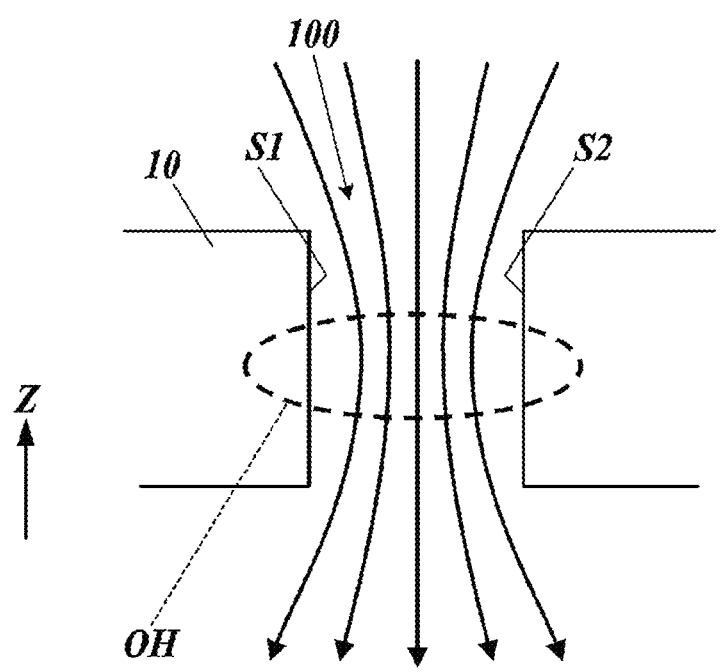
FIG. 9 is a diagram illustrating an operation of the long particles that are centrally arranged.

FIG. 8 is a photographic image illustrating a cross section of a principal portion of the cover member, the cross section including the long particles that are centrally arranged. FIG. 9 is a diagram illustrating an operation of the long particles that are centrally arranged.

In the through hole 100 of the present embodiment, in the longitudinal cross section, the first inner wall S1, the second inner wall S2, or both of these inner walls may include long particles R1c each of which occupies a center portion (a portion located at the same level as a center O1 of the through hole 100) of a corresponding one of the inner walls in the Z direction. Alternatively, a string SQR1c of the long particles R1 may occupy the center portion of each of the inner walls in the Z direction.

FIG. 9 is based on the assumption that the inner walls of the through hole 100 are each an ideal smooth surface without fine irregularities. In this case, the flow of the gas flowing into the through hole 100 becomes most uniform in a center portion OH of the through hole 100 in the Z direction (the thickness direction), and the shorter the distance between the gas and each of the ends of the through hole 100, the larger the influence of each of the openings, which in turn results in deterioration of the uniformity of the flow. Accordingly, even if the entire first inner wall S1 and the entire second inner wall S2 of the through hole 100 in the Z direction are rough, and the roughness of each portion has an influence on the gas flow, this influence is less noticeable at the ends where the uniformity of the flow has already been low and becomes noticeable at the center portion OH where the flow is uniform. Thus, an effect of smoothing the inner walls of the through hole 100 ideally becomes notable in the center portion OH where the flow is uniform.

Consequently, in the through hole 100, one of the long particles R1c or the string SQR1c of the long particles R1 that occupies the center portion of the first inner wall S1 or the center portion of the second inner wall S2 in the Z direction makes the most effective portion of the inner wall smooth. Therefore, turbulence of the gas flow when the gas flows through the through hole 100 can be effectively suppressed, and improvement of the accuracy of the electronic device 60 can be achieved.

As described above, since the cover member 10 of the present embodiment is made of the above-mentioned ceramic material, which is formed of a large number of particles bonded together, compared with the case where iron or the like is used as a raw material, weight reduction and cost reduction can be achieved, and high rigidity and a low coefficient of thermal expansion can be obtained. In the case where the base member 63 is made of a ceramic material, the difference in thermal expansion between the base member 63 and the cover member 10 can be reduced. In addition, according to the cover member 10 of the present embodiment, since the plurality of long particles R1 whose longitudinal direction is along the through axis A0 are located in the first inner wall S1 and the second inner wall S2 in the cross section including the through axis A0, the first inner wall S1 and the second inner wall S2 can be made smooth. In addition, by causing the long particles R1 each of which has an aspect ratio of 2 or more and each of whose inclination angle with respect to the through axis A0 is 45 degrees or smaller to account for 20% or more of the length of the first inner wall S1 and the second inner wall S2 of the through hole 100, the first inner wall S1 and the second inner wall S2 can be made further smooth. As a result of the first inner wall S1 and the second inner wall S2 of the through hole 100 becoming smooth, turbulence of the gas that flows through the through hole 100 can be suppressed, and the operating accuracy of the electronic device 60 can be improved.

Note that, if the percentage of the long particles R1, the distribution patterns, the tapered shape, the central arrangement, and the overlapping regions H3 in which the plurality of long particles R1a and R1b overlap one another, each of which have been described above, hold true in a certain single cross section, the above-mentioned effects can be exhibited in the orientation of the cross section. The larger the number of orientations of cross sections in which the above-described details hold true, the more the above-mentioned effects are exhibited in various orientations, and higher effects can be obtained.

In addition, according to the electronic device 60 of the present embodiment including the cover member 10 and an electronic module 80 of the present embodiment that is equipped with the electronic device 60, by improving the characteristics of the through holes 100 and 100a to 100c of the cover member 10, improvement of the operating accuracy can be achieved. As illustrated in FIG. 1, the electronic device 60 is formed by joining the cover member 10 to the base member 63 on which the electronic component 61 is mounted. The base member 63 is made of, for example, a ceramic material such as aluminum nitride ceramic or aluminum oxide ceramic, and the cover member 10 may be joined to the base member 63 with a joining material. The electronic module 80 is formed by mounting the electronic device 60 onto a module substrate 81. In addition to the electronic device 60, other electronic devices, an electronic element, an electric element, and the like may be mounted onto the module substrate 81. The module substrate 81 may be provided with an electrode pad 82, and the electronic device 60 may be joined to the electrode pad 82 with a joining material 83 such as solder.

The embodiment of the present disclosure has been described above. However, the cover member for an electronic device, the package, the electronic device, and the electronic module of the present disclosure are not limited to those of the above-described embodiment. For example, the electronic device may include any electronic component as long as the cover member has a through hole. In addition, the material of the cover member may be any material as long as particles are located on the surface.

INDUSTRIAL APPLICABILITY

The present disclosure can be used for a cover member for an electronic device, a package, an electronic device, and an electronic module.

REFERENCE SIGNS LIST 10 cover member (cover member for electronic device)
10a first surface
10b second surface
60 electronic device
61 electronic component
62 package
63 base member
80 electronic module
81 module substrate
100, 100a to 100c through hole
A0 through axis
S1 first inner wall
S2 second inner wall
R particle
R1 long particle
R1a, R1b partially overlapped long particle
R1c long particle located at center in thickness direction of cover member
SQR1c string of long particles located at center in thickness direction of cover member
R2 specific shaped particle
H1 region in which long particles are contiguously arranged
H2 region in which long particle is positioned to face another long particle
H3 overlapping region

The invention claimed is:

1. A cover member for an electronic device comprising:
   a through hole extending between a first surface and a second surface; and
   a plurality of long particles that are present in at least one inner wall facing the through hole and whose longitudinal direction is along a through axis of the through hole in a cross section including the through axis.

2. The cover member for the electronic device according to claim 1,
   wherein each of the long particles has an aspect ratio of 2 or more, and an inclination angle of each of the long particles with respect to the through axis is 45 degrees or smaller, and
   wherein the plurality of long particles account for 20% or more of a length of the at least one inner wall facing the through hole.

3. The cover member for the electronic device according to claim 1,
   wherein the at least one inner wall includes a first inner wall and a second inner wall, and the long particles are located in both the first inner wall and the second inner wall.

4. The cover member for the electronic device according to claim 3, further comprising:
   a portion in which first long particles that are the long particles located in the first inner wall and second long particles that are the long particles located in the second inner wall face one another.

5. The cover member for the electronic device according to claim 1,
   wherein the at least one inner wall has a portion in which the long particles are contiguously arranged.

6. The cover member for the electronic device according to claim 1,
   wherein the long particles are located at a center of the at least one inner wall in a thickness direction of the cover member.

7. The cover member for the electronic device according to claim 1,
   wherein the at least one inner wall has an overlapping region in which the long particles that are located in the at least one inner wall and that are adjacent to each other overlap each other in a length direction.

8. The cover member for the electronic device according to claim 7,
   wherein the overlapping region is less than half a length of the long particles.

9. A package comprising:
a base member on which an electronic component is to be mounted; and
the cover member for the electronic device according to claim 1 that is assembled to the base member.

10. A device comprising:
the package according to claim 9; and
the electronic component that is mounted on the base member.

11. An electronic module comprising:
a module substrate; and
the device according to claim 10 that is mounted on the module substrate.

* * * * *